United States Patent
Wu et al.

(10) Patent No.: US 10,510,693 B2
(45) Date of Patent: Dec. 17, 2019

(54) SEMICONDUCTOR PACKAGE STRUCTURE

(71) Applicant: Taiwan Semiconductor Manufacturing Co., Ltd., Hsinchu (TW)

(72) Inventors: Kai-Chiang Wu, Hsinchu (TW); Chun-Lin Lu, Hsinchu (TW); Chao-Wen Shih, Hsinchu County (TW); Han-Ping Pu, Taichung (TW); Nan-Chin Chuang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 44 days.

(21) Appl. No.: 15/717,940

(22) Filed: Sep. 28, 2017

(65) Prior Publication Data
US 2019/0096828 A1    Mar. 28, 2019

(51) Int. Cl.
| | | |
|---|---|---|
| *H01L 23/66* | (2006.01) | |
| *H01L 23/538* | (2006.01) | |
| *H01L 21/48* | (2006.01) | |
| *H01L 21/56* | (2006.01) | |
| *H01Q 21/06* | (2006.01) | |
| *H01Q 1/22* | (2006.01) | |
| *H01L 23/31* | (2006.01) | |

(52) U.S. Cl.
CPC .......... *H01L 23/66* (2013.01); *H01L 21/486* (2013.01); *H01L 21/4853* (2013.01); *H01L 21/4857* (2013.01); *H01L 21/565* (2013.01); *H01L 21/568* (2013.01); *H01L 23/3114* (2013.01); *H01L 23/5383* (2013.01); *H01L 23/5384* (2013.01); *H01L 23/5386* (2013.01); *H01L 23/5389* (2013.01); *H01Q 1/2283* (2013.01); *H01Q 21/065* (2013.01); *H01L 2223/6616* (2013.01); *H01L 2223/6677* (2013.01)

(58) Field of Classification Search
CPC ............................ H01L 23/66; H01L 23/3114
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,874 B2 | 6/2015 | Edelstein et al. |
| 9,111,949 B2 | 8/2015 | Yu et al. |

(Continued)

*Primary Examiner* — Marc Anthony Armand
(74) *Attorney, Agent, or Firm* — JCIPRNET

(57) ABSTRACT

A semiconductor package structure including an encapsulation body, an RFIC chip, a first antenna structure, and a second antenna structure is provided. The RFIC chip may be embedded in the encapsulation body. The first antenna structure may be disposed at a lateral side of the RFIC chip, electrically connected to the RFIC chip, and include a first conductor layer and a plurality of first patches opposite to the first conductor layer. The second antenna structure may be stacked on the RFIC chip, electrically connected to the RFIC chip, and include a second conductor layer and a plurality of second patches opposite to the second conductor layer. The first patches and the second patches are located at a surface of the encapsulation body. A first distance between the first conductor layer and the first patches is different from a second distance between the second conductor layer and the second patches.

20 Claims, 16 Drawing Sheets

(56) References Cited

U.S. PATENT DOCUMENTS

| | | |
|---|---|---|
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2008/0246126 A1* | 10/2008 | Bowles ............... H01L 23/3114 257/659 |
| 2017/0236776 A1* | 8/2017 | Huynh ................ H01L 23/3677 257/428 |

* cited by examiner

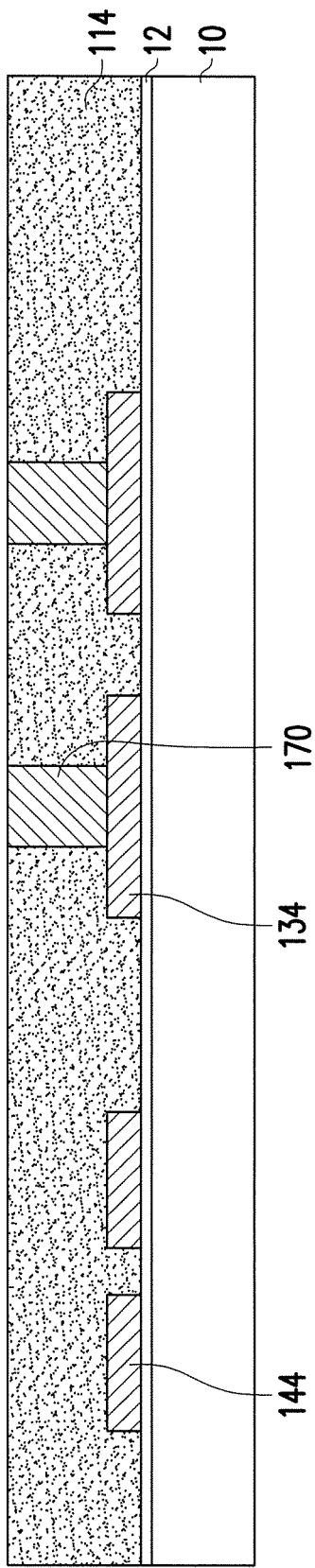
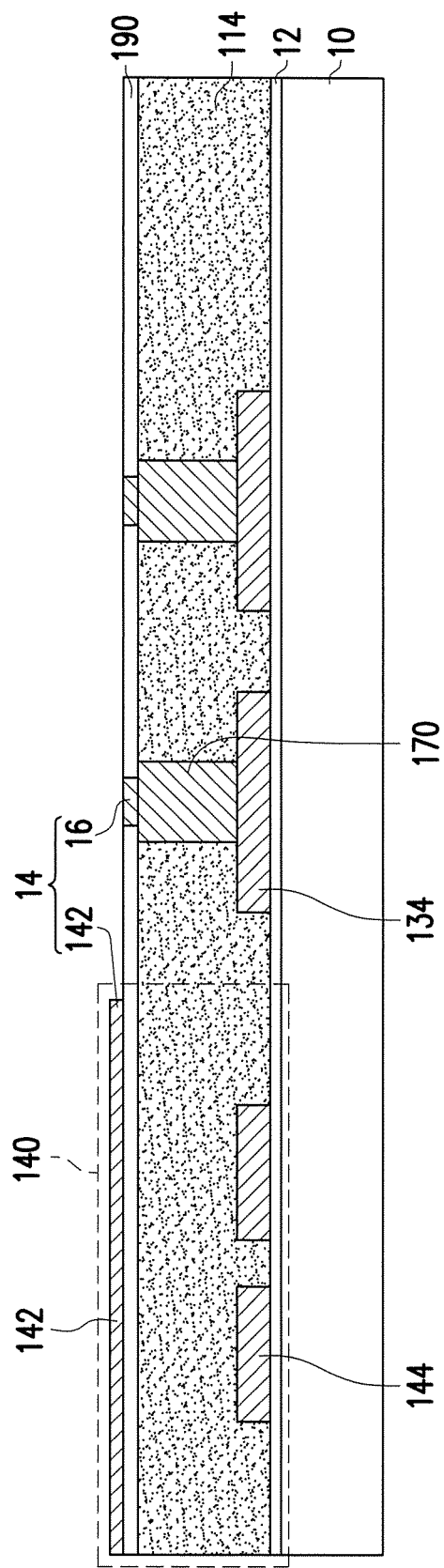
FIG. 6
FIG. 7

SEMICONDUCTOR PACKAGE STRUCTURE

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on. Currently, a technique of integrated fan-out (InFO) packages having more compactness is developed and utilized in various package applications.

For example, the InFO package is utilized for packaging a radio frequency integrated circuit (RFIC) chip with an integrated antenna. However, the performance of the integrated antenna still needs to be improved.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 to FIG. 12 schematically illustrate respective processes of the method of fabricating a semiconductor package structure in accordance with some embodiments of the disclosure.

DETAILED DESCRIPTION

Figure 1:
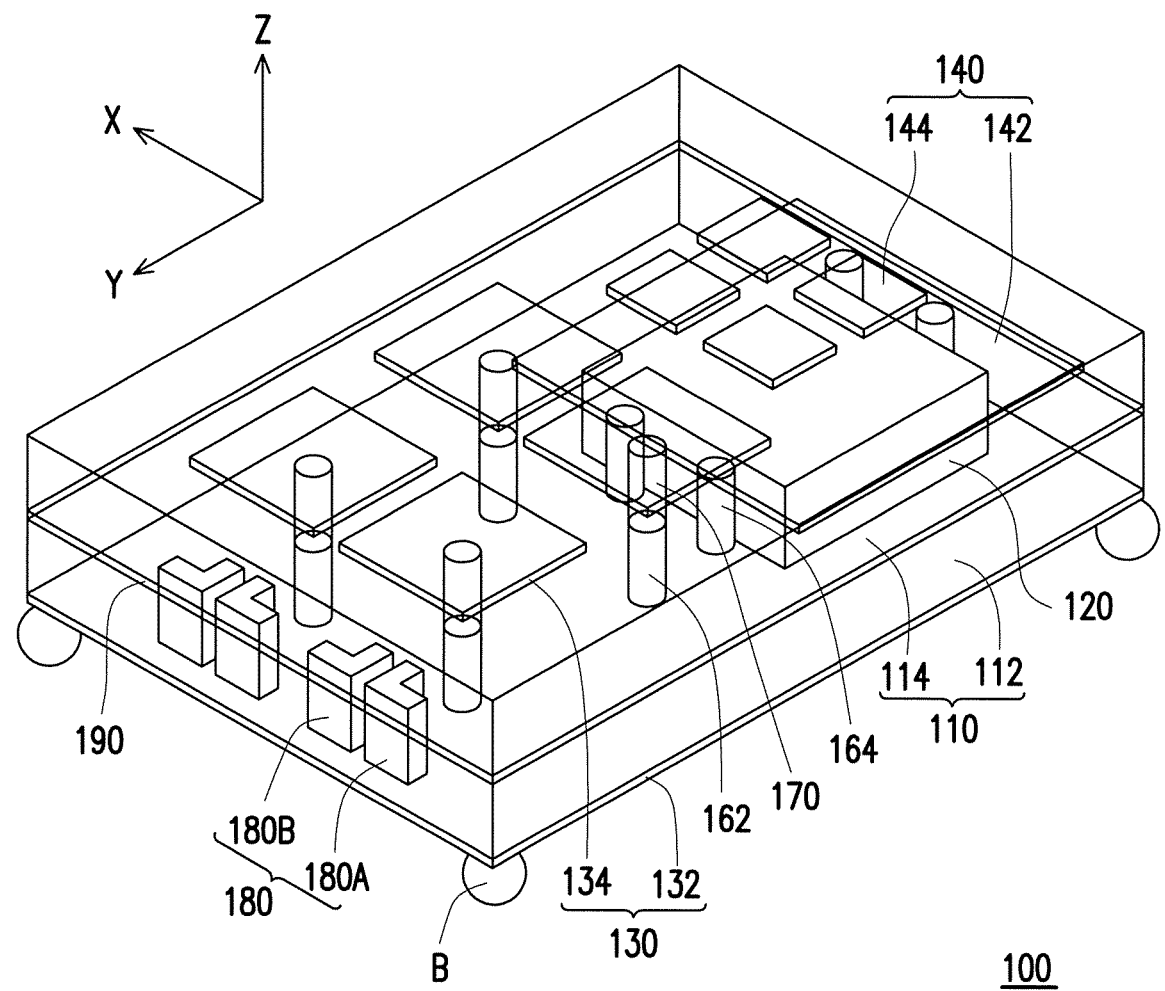
FIG. 1 schematically illustrates a perspective view of a semiconductor package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
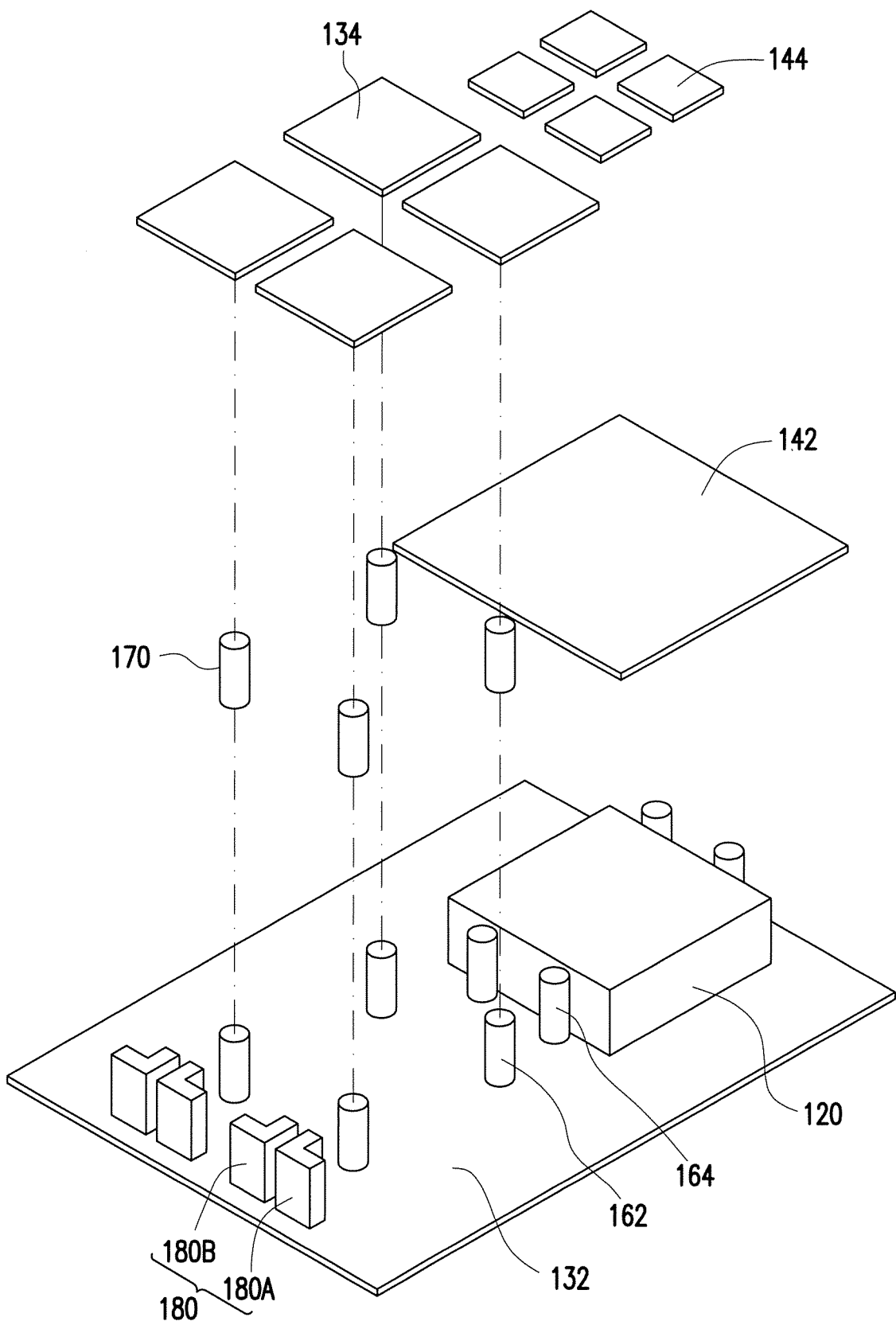
FIG. 2 schematically illustrates an explored view showing some of the components of a semiconductor package structure in accordance with some embodiments.
Figure 3:
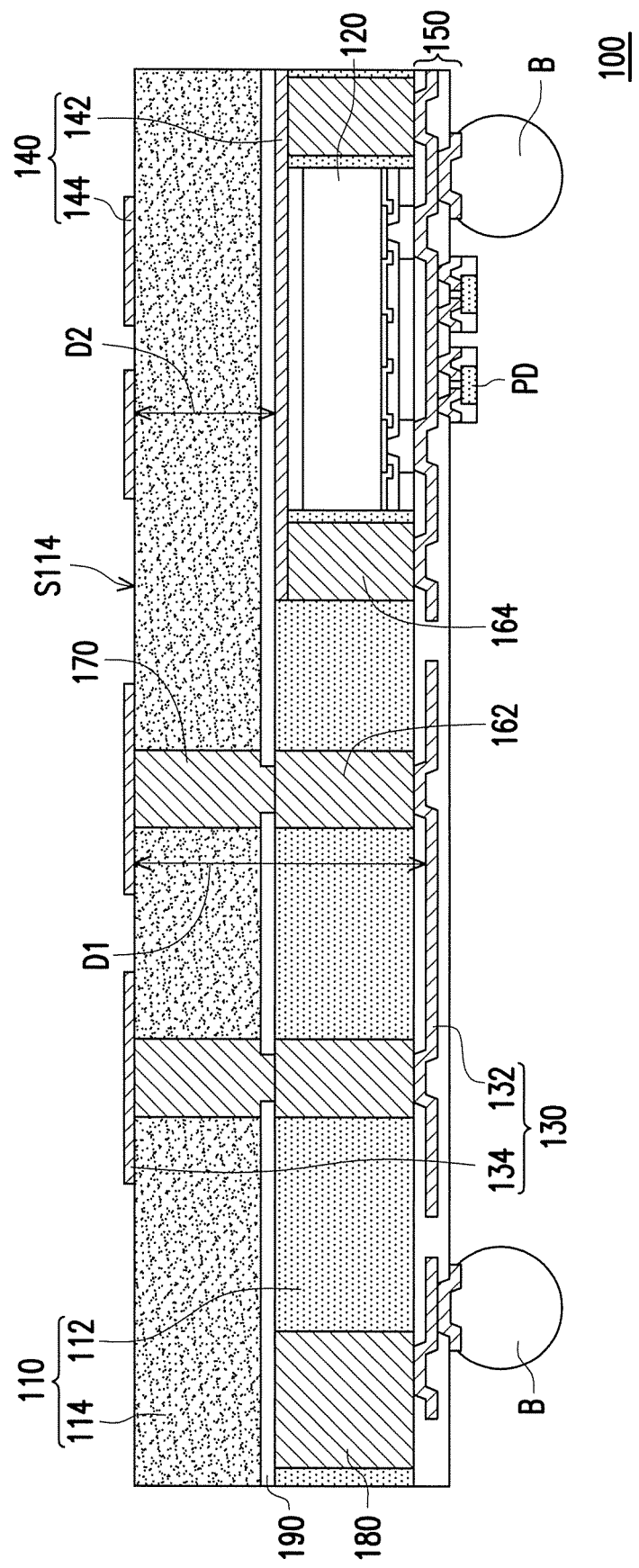
FIG. 3 schematically illustrates a cross sectional view of a semiconductor package structure in accordance with some embodiments.

In FIGS. 1 to 3, a semiconductor package structure 100 may include an encapsulation body 110, a radio frequency integrated circuit (RFIC) chip 120, a first antenna structure 130, a second antenna structure 140, and a redistribution circuit structure 150. In FIG. 1, the X axis, the Y axis and the Z axis shows the dimensions in a stereo space and the dispositions and orientations of respective components in the semiconductor package structure 100 may be better understood by reference to the X axis, the Y axis and the Z axis. In addition, FIG. 1 schematically illustrates the outlines of the respective components in the semiconductor package structure 100 without shielding another component, but in a real product, at least some of these components may be opaque. FIG. 2 omits some components of the semiconductor package structure 100 to clearly present the disposition relationship of the shown components.

As shown in FIGS. 1 to 3, the RFIC chip 120 is embedded in the encapsulation body 110. The first antenna structure 130 is disposed at a lateral side of the RFIC chip 120. The second antenna structure 140 is stacked on the RFIC chip 120. The second antenna structure 140 may be located at the back side of the RFIC chip 120, where the back side is opposite to the side of the active surface of the RFIC chip 120. The redistribution circuit structure 150 is located at the side of the active surface of the RFIC chip 120 and configured to electrically connect the RFIC chip 120 with the first antenna structure 130 and the second antenna structure 140.

The encapsulation body 110 may include a first insulating encapsulation 112 and a second insulating encapsulation 114 disposed on the first insulating encapsulation 112. The RFIC chip 120 is formed embedded in and encapsulated by the first insulating encapsulation 112 of the encapsulation body 110. In some embodiments, one of the first insulating encapsulation 112 and the second insulating encapsulation 114 may have a lower dissipation factor than the other. In some alternative embodiments, the material of the first insulating encapsulation 112 and that of the second insulating encapsulation 114 may be the same.

The first antenna structure 130 may include a first conductor layer 132 and a plurality of first patches 134. The first conductor layer 132 and the first patches 134 are located at two opposite sides of the encapsulation body 110. The first conductor layer 132 may be spaced apart from the first patches 134 by both the first insulating encapsulation 112 and the second insulating encapsulation 114. The first conductor layer 132 may be formed integrally by a portion of the redistribution circuit structure 150. Although FIGS. 1 to 3 schematically show the first conductor layer 132 as a layer structure, the first conductor layer 132 may be patterned and include a ground layer and a feed line, where the feed line may be electrically connected or coupled to the first patches 134. In addition, the semiconductor package structure 100 may further include a plurality of first through via conductors 162 each of which penetrates through the first insulating encapsulation 112 and a plurality of second through via conductors 170 each of which penetrates through the second insulating encapsulation 114. The first through via conductors 162 are connected to the second through via conductors 170 and the first patches 134 may be electrically connected to the RFIC chip 120 through the second through via conductors 170, the first through via conductors 162 and the redistribution circuit structure 150. In some alternative embodiments, the first through via conductors 162 and the second through via conductors 170 may be omitted and the first patches 134 may be electrically coupled to the feed line in the first conductor layer 132 without a physical connection therebetween.

The second antenna structure 140 is stacked on the RFIC chip 120 and may include the second conductor layer 142 and a plurality of second patches 144. The second conductor layer 142 is disposed between the RFIC chip 120 and the second insulating encapsulation 114 of the encapsulation body 110. The second insulating encapsulation 114 is located between the second conductor layer 142 and the second patches 144. Although FIGS. 1 to 3 schematically show the second conductor layer 142 as a layer structure, the second conductor layer 142 may be patterned and include a ground layer and a feed line, where the feed line may be electrically connected or coupled to the second patches 144. In addition, the semiconductor package structure 100 may further includes the first through via conductors 164 each of which penetrates through the first insulating encapsulation 112. Each of the first through via conductors 164 is connected to the redistribution circuit structure 150 at one end and connected to the second conductor layer 142 at the opposite end. Accordingly, the second conductor layer 142 may be electrically connected to the RFIC chip 120 through the first through via conductors 164 and the redistribution circuit structure 150. The second patches 144 may be electrically coupled to the second conductor layer 142 without a physical connection. In some alternative embodiments, one or more second through via conductor penetrating the second insulating encapsulation 114 may be further configured corresponding to the second patches 144 to connect the second patches 144 with the second conductor layer 142.

The semiconductor package structure 100 may further include a lateral antenna 180. The lateral antenna 180 may be electrically connected to the RFIC chip 120 through the redistribution circuit structure 150. The lateral antenna 180 may be embedded in the first insulating encapsulation 112 and located at a lateral side of the RFIC chip 120. In FIG. 2, the lateral antenna 180 may be a dipole antenna consisting of two identical conductive elements 180A and 180B that are bilaterally symmetrically arranged, but the disclosure is not limited thereto. In some alternative embodiments, the lateral antenna 180 may be a Yagi-Uda antenna which may at least include a reflector, a pair of drivers and a director. In FIGS. 1 to 3, the first antenna structure 130 may be located between the lateral antenna 180 and the second antenna structure 140 in the lateral direction, but the disclosure is not limited thereto. In some alternative embodiments, the lateral antenna 180 and the first antenna structure 130 may be located at opposite sides of the second antenna structure 140 in the lateral direction. In some further alternative embodiments, the lateral antenna 180 may be omitted.

In some embodiments, the semiconductor package structure 100 may further include a dielectric layer 190. The dielectric layer 190 may be disposed between the first insulating encapsulation 112 and the second insulating encapsulation 114, but the disclosure is not limited thereto. In some alternative embodiments, the dielectric layer 190 may be omitted such that the first insulating encapsulation 112 may be in contact with the second insulating encapsulation 114. One or more conductive bump B may further be disposed on and electrically connected to the redistribution circuit structure 150. The conductive bump B is used for bonding to an external device and electrically connecting the RFIC chip 120 to the external device. In addition, one or more passive component PD may be connected to the redistribution circuit structure 150 of the semiconductor package structure 100. The passive component PD may include a capacitor, a resistor, an inductor, etc.

In some embodiments, the RFIC chip 120 may include an integrated electrical circuit operating in a frequency range suitable for wireless transmission. The RFIC chip 120 may be electrically connected to the lateral antenna 180 through the redistribution circuit structure 150, electrically connected to the first antenna structure 130 through the redistribution circuit structure 150, the first through via conductors 162 and the second through via conductors 170, and electrically connected to the second antenna structure 140 through the redistribution circuit structure 150 and the first through via conductors 164. The lateral antenna 180, the first antenna structure 130 and the second antenna structure 140 may respectively generate an electromagnetic wave such as a microwave or receive a microwave from an external for the wireless communication function.

As shown in FIGS. 1 to 3, the first patches 134 of the first antenna structure 130 and the second patches 144 of the second antenna structure 140 may be disposed on the same surface S114 of the second insulating encapsulation 114 of the encapsulation body 110, and the first conductor layer 132 of the first antenna structure 130 and the second conductor layer 142 of the second antenna structure 140 may be disposed on two opposite surfaces of the first insulating encapsulation 112. Accordingly, the first distance D1 between the first conductor layer 132 and the first patches 134 is larger than the second distance D2 between the second conductor layer 142 and the second patches 144. In some embodiments, a total thickness of the first insulating encapsulation 112 and the second insulating encapsulation 114 may be 600 μm to 800 μm. As such, the first distance D1 may be ranged from 600 μm to 800 μm or larger which may help to effectively reduce the interference on the first patches 134 caused by the ground layer of the first conductor layer 132. The first patches 134 of the first antenna structure 130 may receive or generate a microwave with lower frequency than the second patches 144 of the second antenna structure 140. Accordingly, the first antenna structure 130 and the second antenna structure 140 may provide different transmission frequencies. In some embodiments, the respective sizes of the first patches 134 may be different from the respective sizes of the second patches 144. As shown in FIGS. 1 to 3, the respective sizes of the first patches 134 may be larger than the respective sizes of the second patches 144, but the disclosure is not limited thereto.

Figure 4:
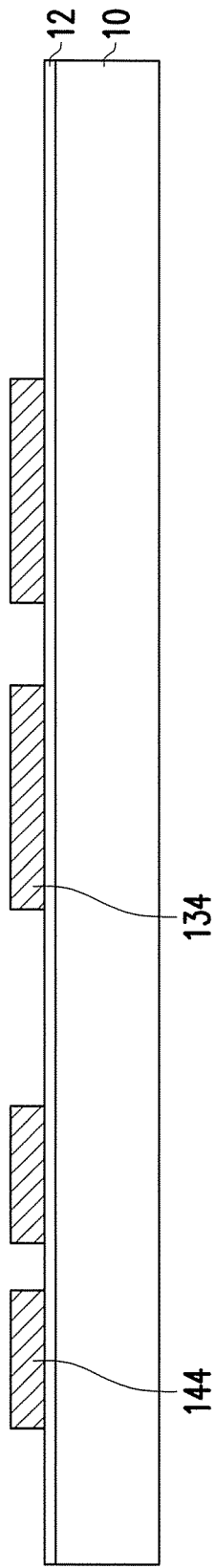

FIG. 4 to FIG. 12 schematically illustrate respective processes of the method of fabricating a semiconductor package structure in accordance with some embodiments of the disclosure. In FIG. 4, a carrier 10 is provided. The carrier 10 may have sufficient rigidity or stiffness for providing a solid stand for the subsequent process. The carrier 10 may be, but not limited to a glass carrier. In some embodiments, the carrier 10 may be removed from the device formed thereon so as to finish the final device and thus a temporary adhesive layer may be formed on the carrier 10. In some embodiments, a dielectric layer 12 may be formed on the carrier 10 and serve as the temporary adhesive layer, but the disclosure is not limited thereto. In addition, a conductive layer (not shown) is formed on the dielectric layer 12 and is patterned to form the first patches 134 and the second patches 144. The conductive layer may be formed on the carrier 10 through chemical vapor deposition (CVD), physical vapor deposition (PVD), atomic layer deposition (ALD), high density plasma CVD (HDPCVD), plating, other suitable methods, and/or combinations thereof. The material of the conductive layer may include, for example, titanium, tungsten, aluminum, copper, metal alloys, metal silicide, other suitable materials, and/or combinations thereof.

Figure 5:
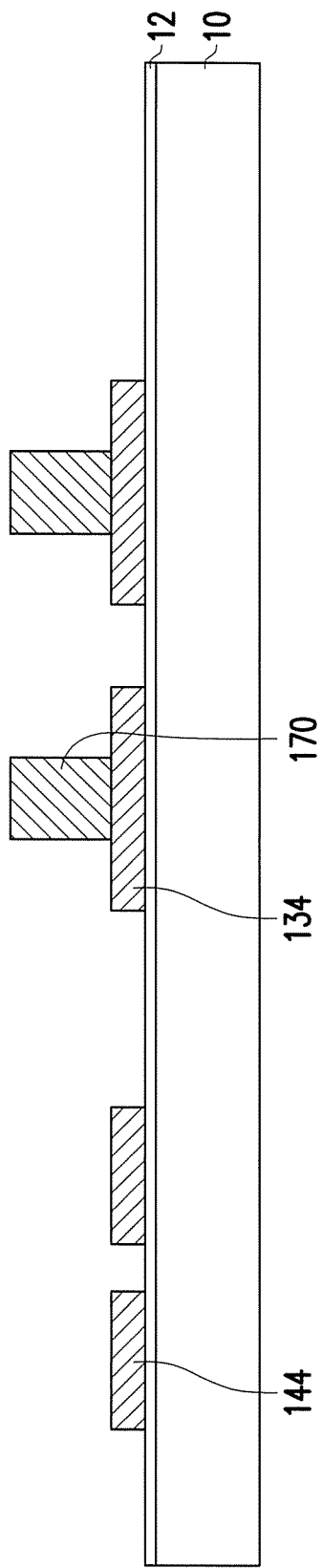

In FIG. 5, the second through via conductors 170 may be formed on the first patches 134. In some embodiments, the second through via conductors 170 may be fabricated by the following process. A pattern defining layer (not shown) having openings with predetermined depths may be formed on the carrier 10 and cover the first patches 134 and the second patches 144. The openings of the pattern defining layer may expose a portion of the first patches 134. Subsequently, a conductive material fills into the openings of the pattern defining layer to form the second through via conductors 170 by chemical vapor deposition (CVD), physical vapor deposition (PVD), atomic layer deposition (ALD), high density plasma CVD (HDPCVD), plating, other suitable methods, and/or combinations thereof. The conductive material includes, for example, titanium, tungsten, aluminum, copper, metal alloys, metal silicide, other suitable materials, and/or combinations thereof. In some embodiments, the thickness of the pattern defining layer may be determined based on the required heights of the second through via conductors 170. Subsequent to the formation of the second through via conductor 170, the pattern defining layer is removed such that the structure as shown in FIG. 5 is achieved.

In FIG. 6, the second insulating encapsulation 114 is formed to encapsulate the first patches 134, the second patches 144 and the second through via conductors 170. A material of the second insulating encapsulation 114 may be a resin capable of being cured through a thermal cure process or UV cure process. In some embodiments, the process of FIG. 5 may be omitted and the process of FIG. 6 may be performed right after the process of FIG. 4.

In FIG. 7, the dielectric layer 190 may be formed on the structure made by performing the processes of FIGS. 4 to 6. The dielectric layer 190 may cover the second insulating encapsulation 114 and may be patterned to expose a portion of the end surfaces of the second through via conductors 170. Subsequently, a circuit structure 14 is formed on the dielectric layer 190, where the circuit structure 14 may include the second conductor layer 142 and the connecting patterns 16. In some embodiments, the dielectric layer 190 may be omitted and the circuit structure 14 may be disposed directly on the second insulating encapsulation 114. In other words, the second conductor layer 142 may be in direct contact with the second insulating encapsulation 114. The second conductor layer 142 is located above and opposite to the second patches 144. The second conductor layer 142 may not overlap the first patches 134. In some embodiments, the second conductor layer 142 may have specific pattern to form at least one feed line configured to be electrically coupled to the second patches 144 and a ground layer. The second conductor layer 142 and the second patches 144 spaced apart by the second insulating encapsulation 114 form the second antenna structure 140. The connecting patterns 16 may be in contact with the second through via conductors 170. In some embodiments, the connecting patterns 16 may be omitted.

Figure 8:
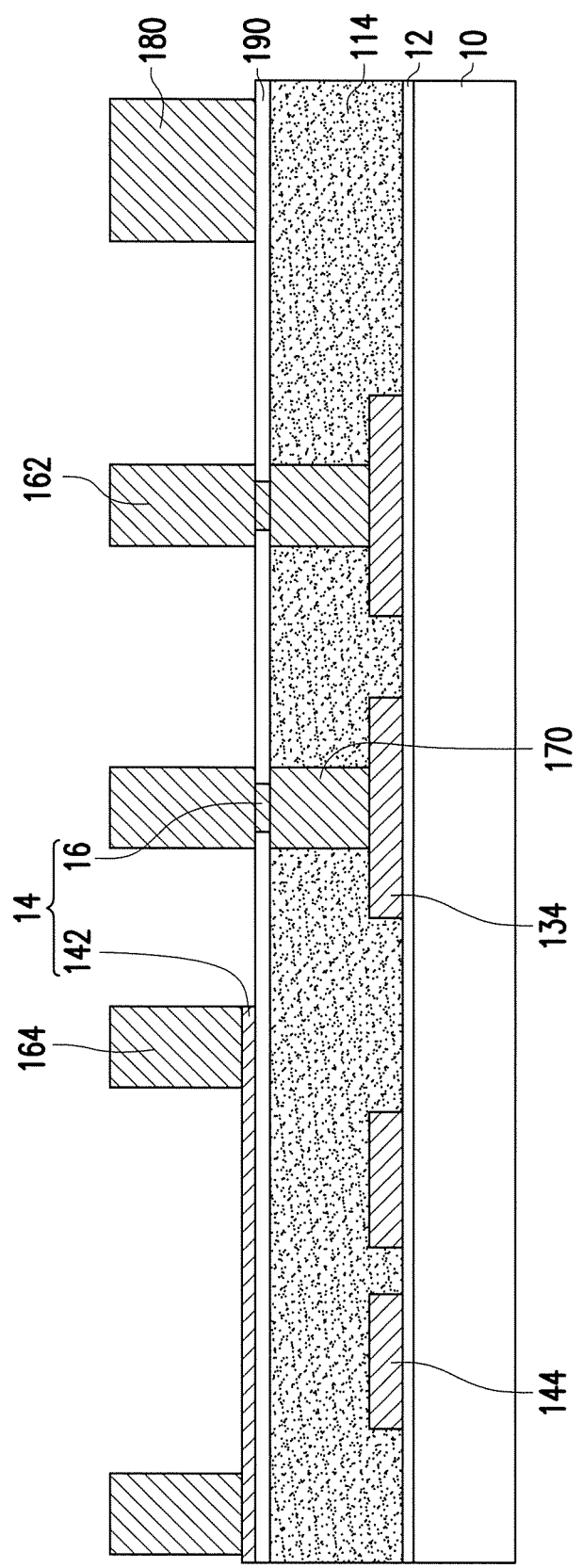

Thereafter, as shown in FIG. 8, the first though via conductors 162 and 164 and the lateral antenna 180 may be formed on the circuit structure 14 and the dielectric layer 190. In some embodiments, the first though via conductors 162 and 164 and the lateral antenna 180 may be fabricated by the following process. A pattern defining layer (not shown) having openings with predetermined depths may be formed on the carrier 10 and cover the circuit structure 14 and the dielectric layer 190. The openings of the pattern defining layer may expose the second conductor layer 142, the connecting patterns 16, and the dielectric layer 190. Subsequently, a conductive material fills into the openings of the pattern defining layer to form the first through via conductors 162, the first through via conductors 164, and the lateral antenna 180 by chemical vapor deposition (CVD), physical vapor deposition (PVD), atomic layer deposition (ALD), high density plasma CVD (HDPCVD), plating, other suitable methods, and/or combinations thereof. The conductive material includes, for example, titanium, tungsten, aluminum, copper, metal alloys, metal silicide, other suitable materials, and/or combinations thereof. In some embodiments, the thickness of the pattern defining layer may be determined based on the required height of the first through via conductors 162 and 164 and the lateral antenna 180. Subsequent to the formation of the first through via conductors 162 and 164 and the lateral antenna 180, the pattern defining layer is removed such that the structure as shown in FIG. 8 is achieved. The first through via conductors 162 connected to the connecting patterns 16 may be electrically connected to the second through via conductors 170. Accordingly, the connecting patterns 16 may be configured to electrically and physically connect the first through via conductors 162 and the second through via conductors 170. The first through via conductors 164 may be electrically connected to the second conductor layer 142.

Figure 9:
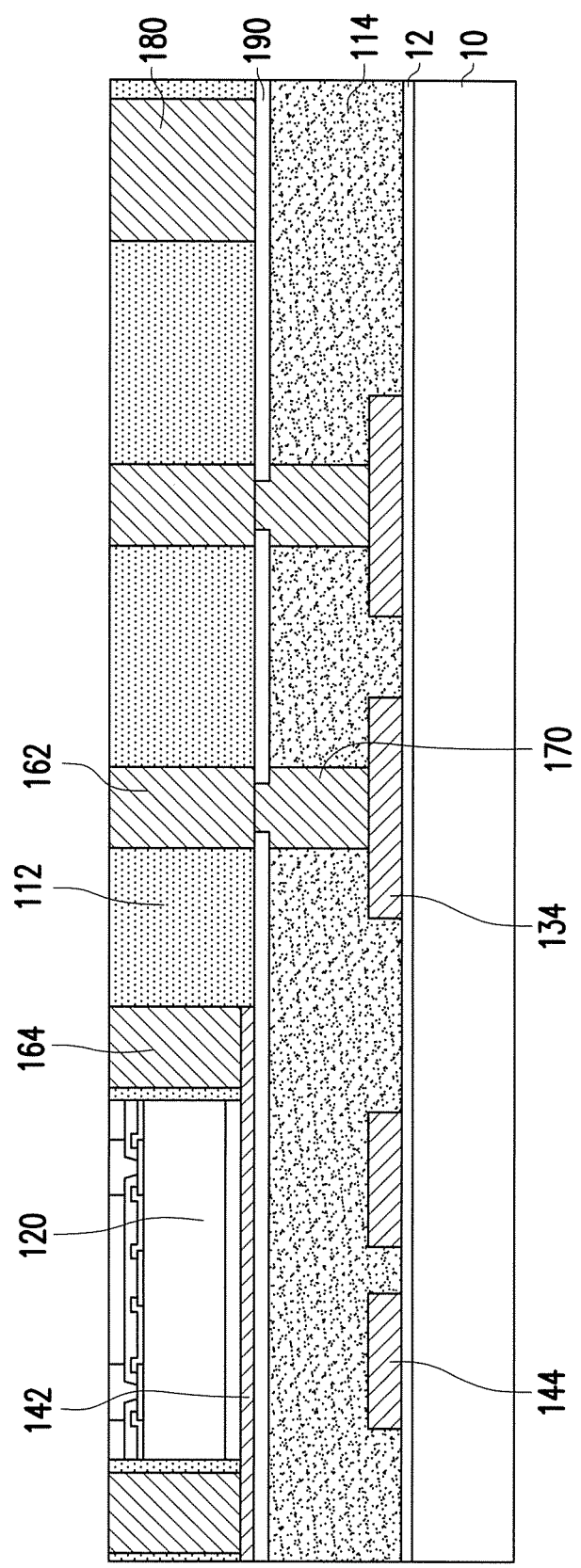

In FIG. 9, the RFIC chip 120 may be picked up and placed on the second conductor layer 142. The RFIC chip 120 is attached on the second conductor layer 142 in a manner the active surface facing upwards as oriented in this illustrative example. The RFIC chip 120 may include semiconductor devices or integrated circuits that have been previously manufactured on a semiconductor substrate. The RFIC chip 120 may include one or more layers of electrical circuitry and/or electronic functions formed thereon, and may include conductive lines, vias, capacitors, diodes, transistors, resistors, inductors, and/or other electrical components, for example (not shown). The RFIC chip 120 is attached onto the second conductor layer 142 by using a die attach film (not marked). A material of the die attach film may include a thermoplastic material, such as epoxy resin, phenol resin, or poly-olefin, as examples, although alternatively, other thermoplastic materials or polymers compatible with semiconductor processing environments may be used. The die attach film may be formed on the second conductor layer 142 using a lamination process, for example. Alternatively, the die attach film may be applied by other techniques and may have other dimensions.

In addition, subsequent to the attachment of the RFIC chip 120 onto the second conductor layer 142 through the die attach film, the first insulating encapsulation 112 is formed to encapsulate the RFIC chip 120, the lateral antenna 180 and the first through via conductors 162 and 164 as shown in FIG. 9. A material of the first insulating encapsulation 112 may be a resin capable of being cured through a thermal cure process or a UV cure process. In some embodiments, the material of the first insulating encapsulation 112 may be the same as that of the second insulating encapsulation 114, but the disclosure is not limited thereto. The material of the first insulating encapsulation 112 may have a dissipation factor different from that of the second insulating encapsulation 114. In some embodiments, a grinding process or a polishing process may be performed after the formation of the first insulating encapsulation 112 to expose a portion of the electrical circuitry of the RFIC chip 120, the first through via conductors 162, the first through via conductors 164 and the lateral antenna 180.

Figure 10:
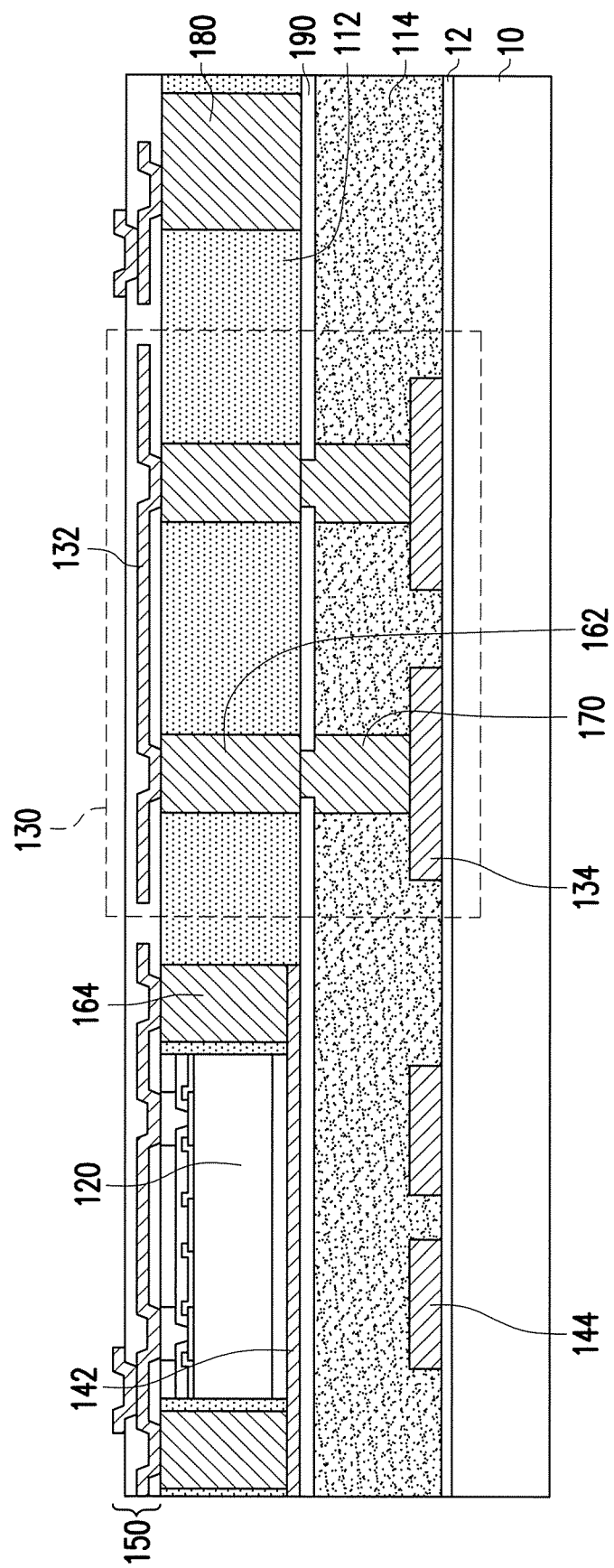

Thereafter, in FIG. 10, the redistribution circuit structure 150 may be formed on the first insulating encapsulation 112. The redistribution circuit structure 150 may include at least one metal layer forming conductive traces which may provide a predetermined layout for mapping the electrical conduction paths of the RFIC chip 120. A portion of the metal layer in the redistribution circuit structure 150 may extend exceeding the RFIC chip 120 and form the first conductor layer 132. The first conductor layer 132 may be electrically connected to the RFIC chip 120 through the redistribution circuit structure 150. In addition, a portion of the redistribution circuit structure 150 may be connected to the first through via conductors 164 so that the second conductor layer 142 is electrically connected to the RFIC chip 120 through the redistribution circuit structure 150 and the first through via conductors 164. The lateral antenna 180 may also be electrically connected to the RFIC chip 120 through another portion of the redistribution circuit structure 150.

The first conductor layer 132 may be disposed opposite to the first patches 134. In the embodiment, the first conductor layer 132 may have specific pattern to form a feed line and a ground layer, where the feed line may be configured to be electrically coupled or connected to the first patches 134 to form the first antenna structure 130 located beside the RFIC chip 120. The first conductor layer 132 and the first patches 134 are spaced apart by at least the first insulating encapsulation 112 and the second insulating encapsulation 114. In the embodiment, the first conductor layer 132 may be electrically connected to the first patches 134 through the first through via conductors 162 and the second through via conductors 170. In some alternative embodiments, the first through via conductors 162 and the second through via conductors 170 may be omitted and the first conductor layer 132 may be electrically coupled to the first patches 134 without a directly physical connection.

Figure 11:
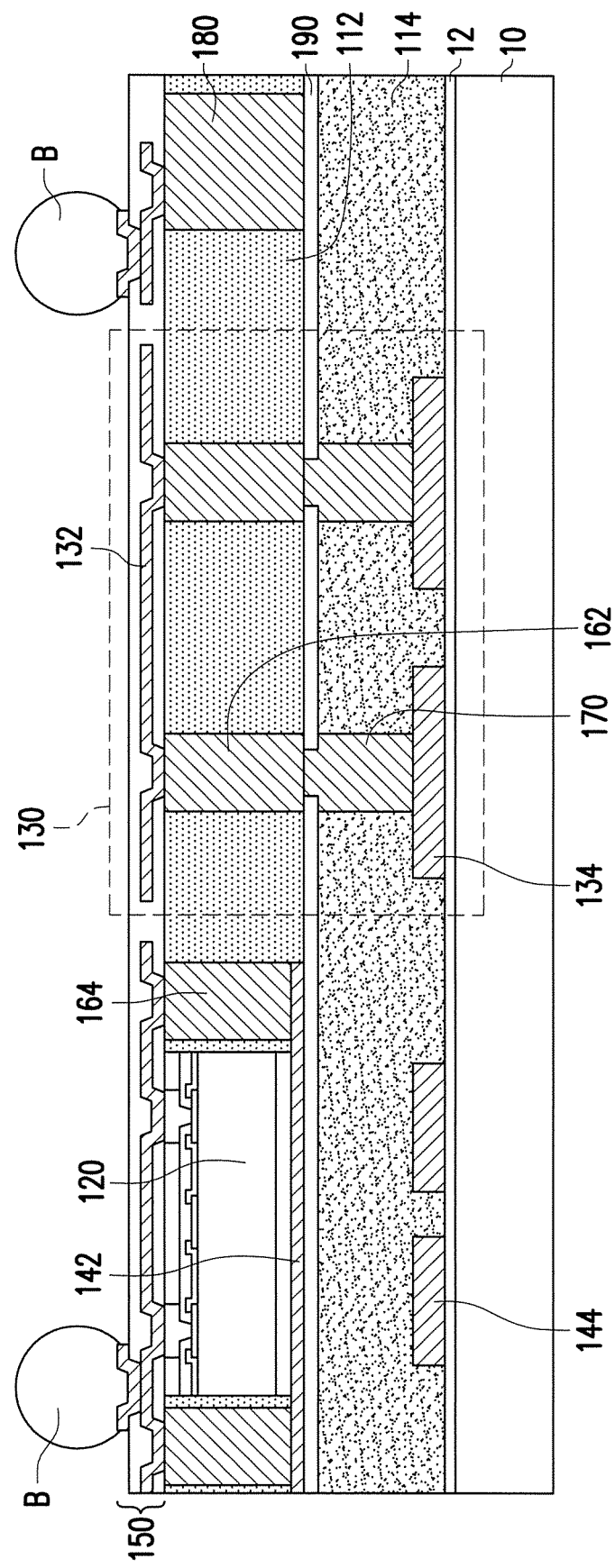
Figure 12:
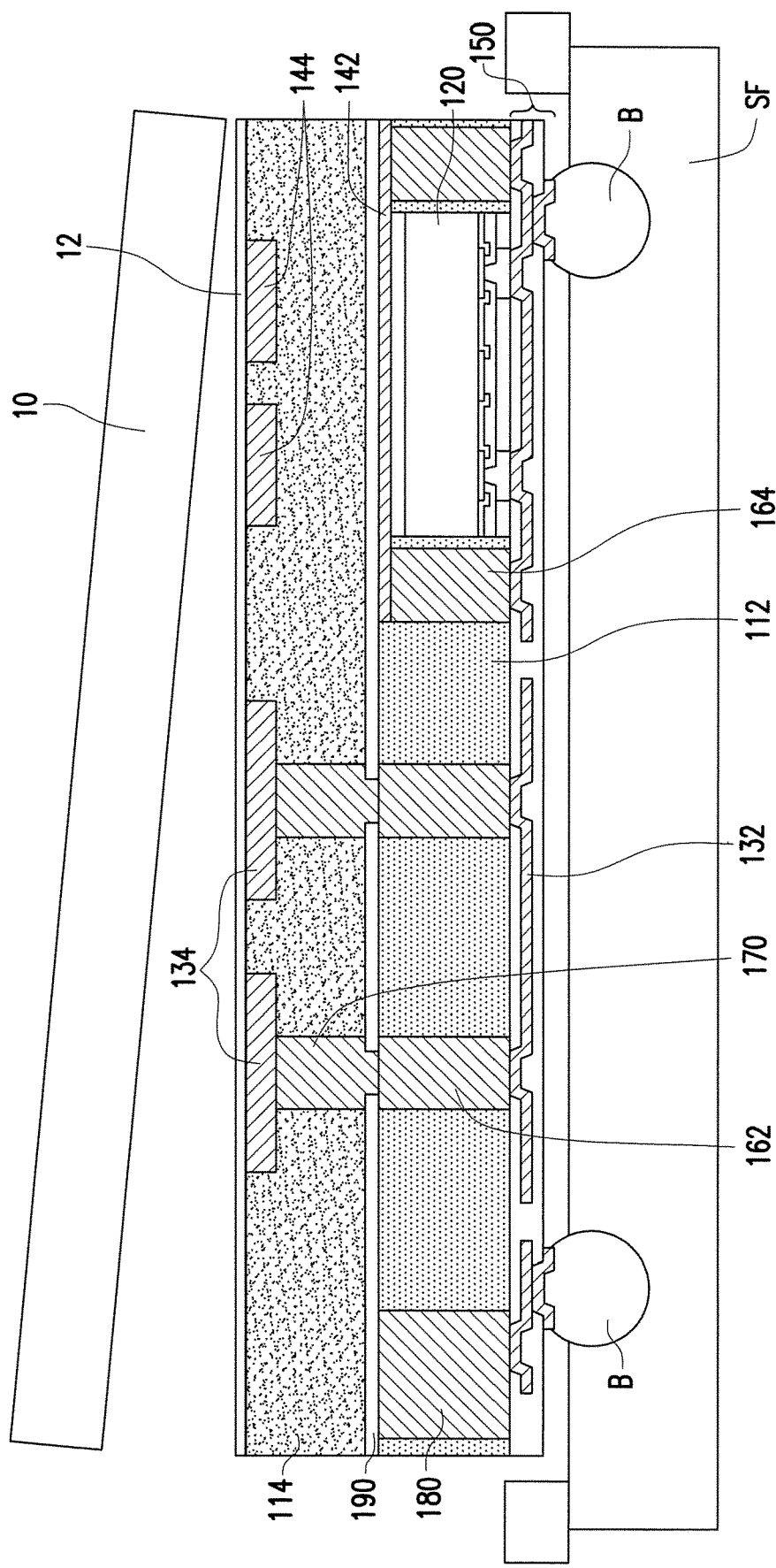

In FIG. 11, one or more conductive bump B may be formed on the redistribution circuit structure 150 for bonding to an external component such as a circuit board. The conductive bump B may be a controlled collapsing chip connector ("C4"), a solder bump, or other connector capable of connecting the redistribution circuit structure 150 to an external device. Thereafter, as shown in FIG. 12, the device fabricating by performing the processes of FIGS. 4 to 11 is mounted on a support frame SF and a debonding process is performed to remove the carrier 10 from the dielectric layer 12. In some embodiments, the debonding process may include applying an energy beam to the boundary between the carrier 10 and the dielectric layer 12. During or after the debonding process, the dielectric layer 12 may be partially or wholly removed. The first patches 134 and the second patches 144 may be exposed and the semiconductor package structure 100 as shown in FIGS. 1 to 3 may be achieved.

Figure 13:
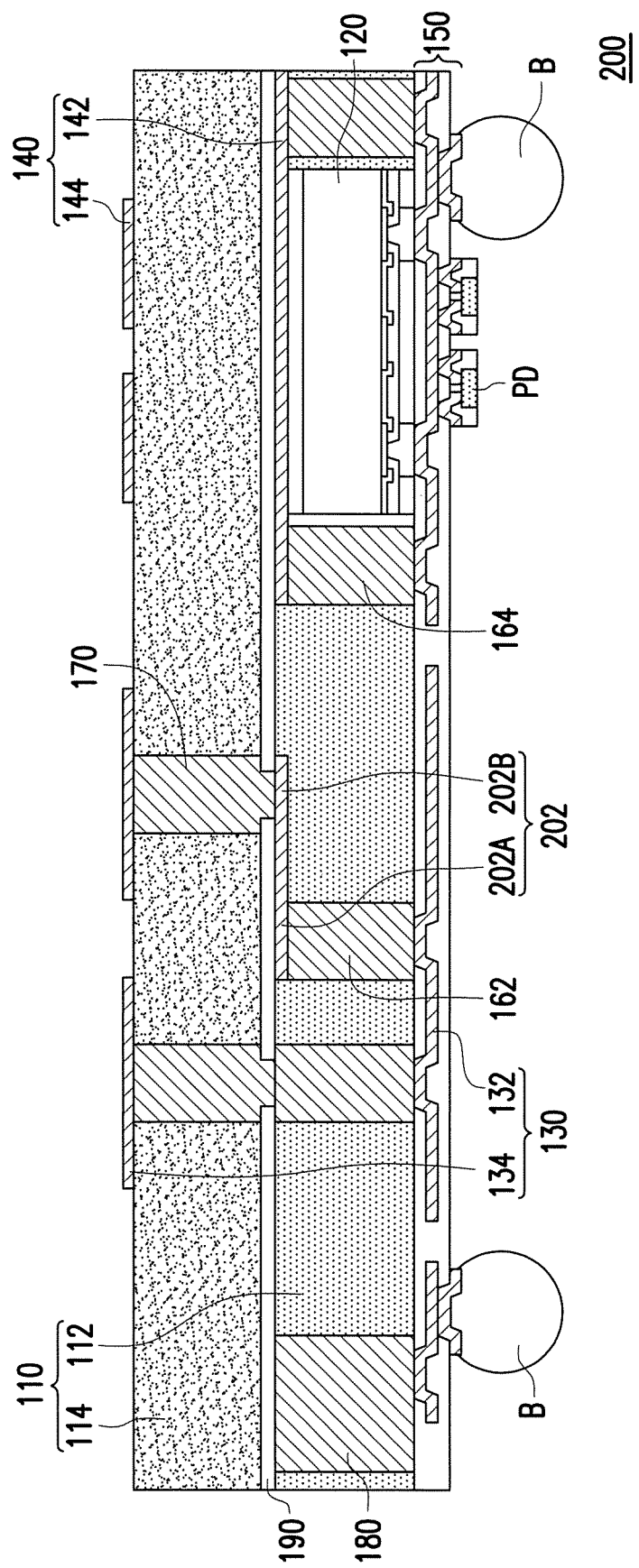
FIG. 13 schematically illustrates a cross section of a semiconductor package structure in accordance with some alternative embodiments.

FIG. 13 schematically illustrates a cross section of a semiconductor package structure in accordance with some alternative embodiments. In FIG. 13, a semiconductor package structure 200 may be similar to the semiconductor package structure 100 and include an encapsulation body 110, an RFIC chip 120, a first antenna structure 130, a second antenna structure 140, a redistribution circuit structure 150, a plurality of first through via conductors 162 and 164, a plurality of second through via conductors 170, a lateral antenna 180, a dielectric layer 190, a plurality of conductive bumps B, and a plurality of passive components PD. The above components may have the same or similar structures, functions, and disposition locations as those depicted in FIGS. 1 to 3 and may be fabricated by performing the processes of FIGS. 4 to 12.

In the semiconductor package structure 200, the connecting pattern 202 may be connected between one first through via conductor 162 and one second through via conductor 170. In some embodiments, the connecting pattern 202 may be fabricated using the process depicted in FIG. 7. The first through via conductor 162 in the embodiment may not align or overlap the second through via conductor 170 and the connecting pattern 202 may extend exceeding the end surface of the second through via conductor 170. As such, the first through via conductor 162 may be connected to a first section 202A of the connecting pattern 202 and the second through via conductor 170 may be connected to a second section 202B of the connecting pattern 202. The first section 202A and the second section 202B may not overlap. The connecting pattern 202 may facilitate to connect the first through via conductors 162 and the second through via conductors 170 that are disposed in different locations.

Figure 14:
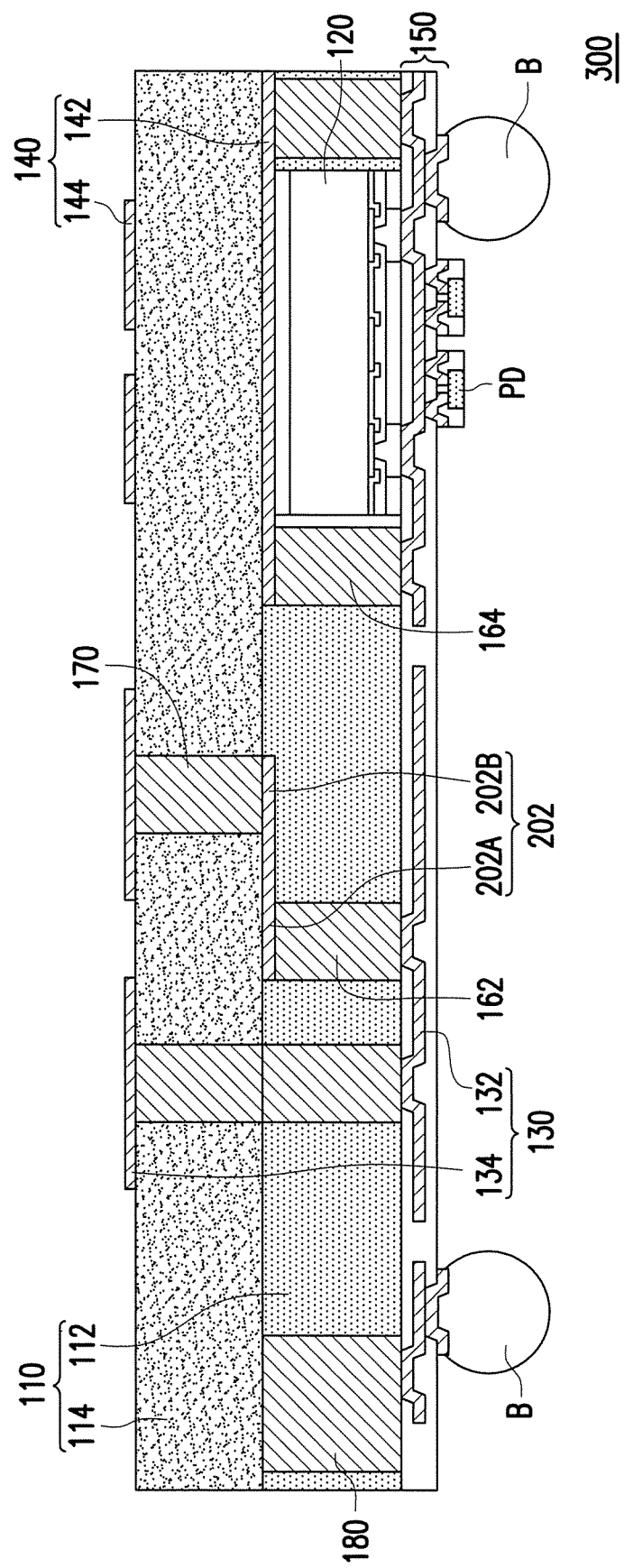
FIG. 14 schematically illustrates a cross section of a semiconductor package structure in accordance with some alternative embodiments.

FIG. 14 schematically illustrates a cross section of a semiconductor package structure in accordance with some alternative embodiments. In FIG. 14, a semiconductor package structure 300 may be similar to the semiconductor package structure 200, but the semiconductor package structure 300 does not include the dielectric layer 190. Namely, the semiconductor package structure 300 may include an encapsulation body 110, an RFIC chip 120, a first antenna structure 130, a second antenna structure 140, a redistribution circuit structure 150, a plurality of first through via conductors 162 and 164, a plurality of second through via conductors 170, and a lateral antenna 180. In the embodiment, the encapsulation body 110 includes the first insulating encapsulation 112 and the second insulating encapsulation 114 and the first insulating encapsulation 112 may be in direct contact with the second insulating encapsulation 114 without a dielectric layer interposed therebetween.

Figure 15:
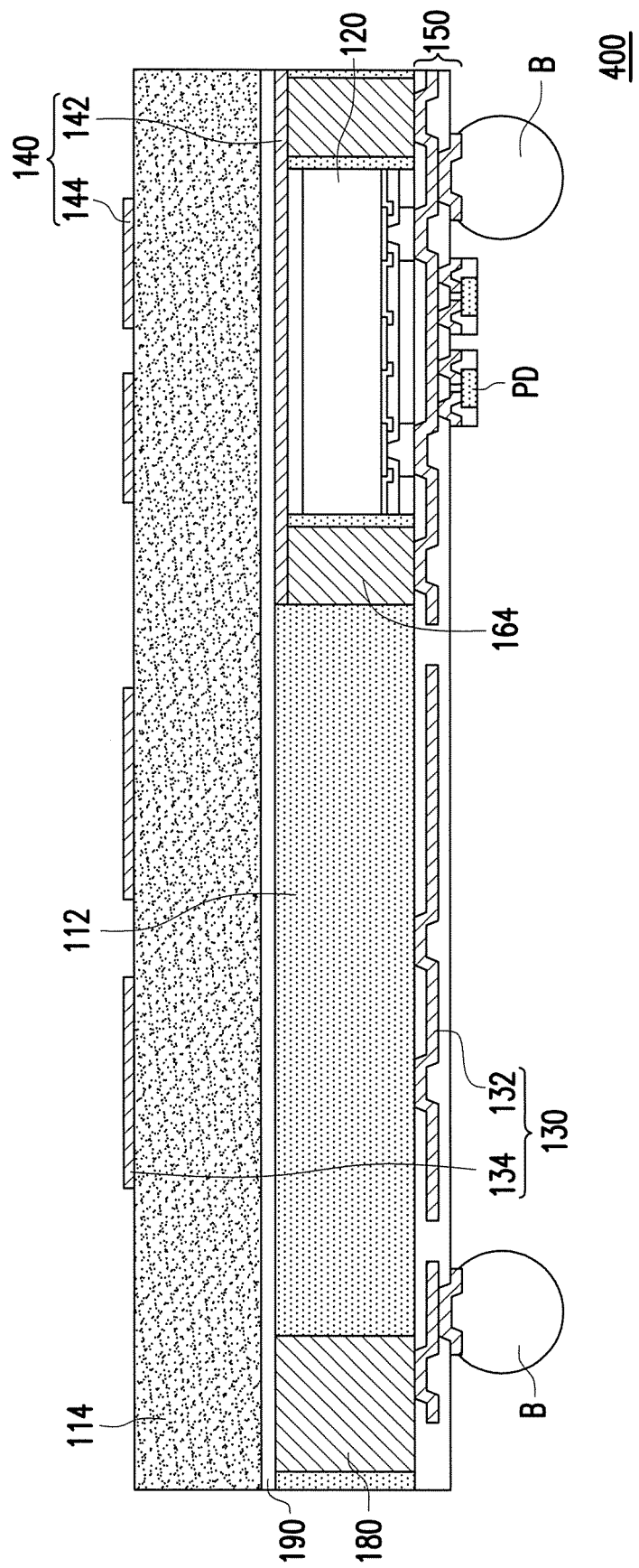
FIG. 15 schematically illustrates a cross section of a semiconductor package structure in accordance with some alternative embodiments.

FIG. 15 schematically illustrates a cross section of a semiconductor package structure in accordance with some alternative embodiments. In FIG. 15, a semiconductor package structure 400 may be similar to the semiconductor package structure 100, but the semiconductor package structure 400 does not include the first through via conductors 162 and the second through via conductors 170. In the semiconductor package structure 400, the first patches 134 may be electrically coupled to the first conductor layer 132 without a physical connection and the second patches 144 may be electrically coupled to the second conductor layer 142 without a physical connection. In addition, the second conductor layer 142 may be electrically connected to the RFIC chip 120 through the first through via conductors 164 and the redistribution circuit structure 150.

Figure 16:
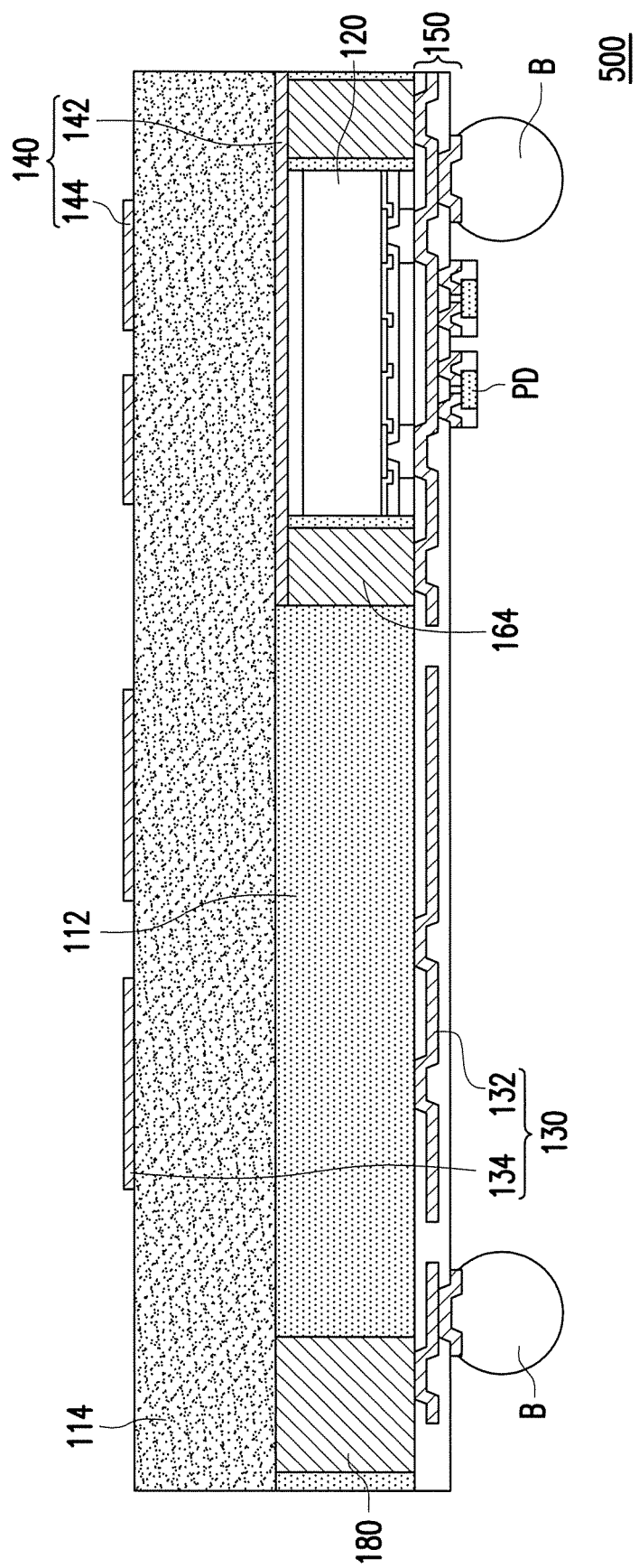
FIG. 16 schematically illustrates a cross section of a semiconductor package structure in accordance with some alternative embodiments.

FIG. 16 schematically illustrates a cross section of a semiconductor package structure in accordance with some alternative embodiments. In FIG. 16, a semiconductor package structure 500 may be similar to the semiconductor package structure 400, but the semiconductor package structure 500 does not include the dielectric layer 190. In the embodiment, the first insulating encapsulation 112 may be in direct contact with the second insulating encapsulation 114 without a dielectric layer interposed therebetween.

In some embodiments, the first antenna structure 130 and the second antenna structure 140 in the semiconductor package structure 100, 200, 300, 400, or 500 may be configured to transmit the microwave in the vertical direction while the lateral antenna 180 may be configured to transmit the microwave in the lateral direction for the wireless communication function. The semiconductor package structure 100, 200, 300, 400, or 500 may be an antenna integrated package that is encapsulated by the encapsulation body 110 including the first insulation encapsulation 112 and the second insulating encapsulation 114. In some embodiments, at least one of the lateral antenna 180 and the second antenna structure 140 may be omitted, but the disclosure is not limited thereto.

Figure 17:
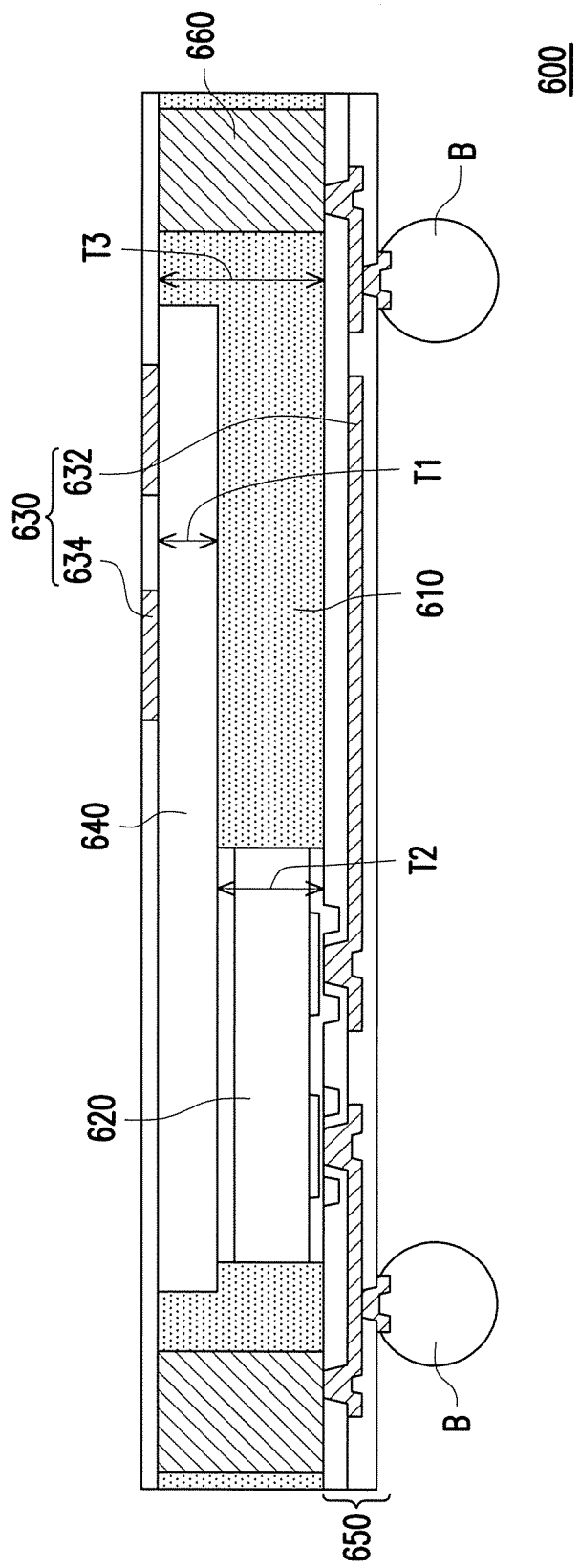
FIG. 17 schematically illustrates a cross section of a semiconductor package structure in accordance with some alternative embodiments.

FIG. 17 schematically illustrates a cross section of a semiconductor package structure in accordance with some alternative embodiments. In FIG. 17, a semiconductor package structure 600 may include an insulating encapsulation 610, an RFIC chip 620, an antenna structure 630, and an isolation layer 640. The RFIC chip 620 is encapsulated by and embedded in the insulating encapsulation 610. The antenna structure 630 may be disposed at the lateral side of the RFIC chip 620. The antenna structure 630 may include a conductor layer 632 and a plurality of patches 634. The conductor layer 632 and the patches 634 are located at two opposite sides of the insulating encapsulation 610. The isolation layer 640 is embedded in the insulating encapsulation 610 and at least located between the conductor layer 632 and the patches 634. In the embodiment, a dissipation factor of the isolation layer 640 is lower than that of the insulating encapsulation 610.

The semiconductor package structure 600 may further include a redistribution circuit structure 650 and a lateral antenna 660. The redistribution circuit structure 650 is disposed on the insulating encapsulation 610 and electrically connected to the RFIC chip 620. In some embodiments, the conductor layer 632 of the antenna structure 630 and the redistribution circuit structure 650 may be located at the same side of the insulating encapsulation 610. The conductor layer 632 may be formed integrally in a metal layer of the redistribution circuit structure 650 and electrically connected to the RFIC chip 620. In the antenna structure 630, the conductor layer 632 may include a feed line coupled to the patches 634 and a ground layer opposite to the patches 634.

The lateral antenna 660 may be embedded in and encapsulated by the insulating encapsulation 610. The RFIC chip 620 may be electrically connected to the antenna structure 630 and the lateral antenna 660 through the redistribution circuit structure 650. The antenna structure 630 may be a patch antenna. The lateral antenna 660 may be a dipole antenna consisting of two identical conductive elements that are bilaterally symmetrically arranged or a Yagi-Uda antenna which includes a reflector, a pair of drivers and a director. The antenna structure 630 in the semiconductor package structure 600 may be configured to transmit the microwave in the vertical direction while the lateral antenna 660 may be configured to transmit the microwave in the lateral direction for the wireless communication function. The semiconductor package structure 600 may be an antenna integrated package. In some embodiments, the lateral antenna 660 may be omitted, but the disclosure is not limited thereto.

As shown in FIG. 17, the isolation layer 640 may extend exceeding the patches 634 and overlap the RFIC chip 620. The RFIC chip 620 may be stacked on the isolation layer 640. The isolation layer 640 may be encapsulated by and embedded in the insulating encapsulation 610. As shown in FIG. 17, a sum of the thickness T1 of the isolation layer 640 and the thickness T2 of the RFIC chip 620 may be substantially the same as the thickness T3 of the insulating encapsulation 610. The distance between the conductor layer 632 and the patches 634 may be proximate to the sum of the thickness T1 of the isolation layer 640 and the thickness T2 of the RFIC chip 620 and sufficient to effectively reduce the interference between the ground layer of the conductor layer 632 and the patches 634. In addition, the isolation layer 640 has a dissipation factor lower than that of the insulating encapsulation 610 so that the interference between the ground layer and the patches 634 may be further effectively reduced. For example, the dissipation factor (Df) of the isolation layer 640 may be not greater than 0.01. Therefore, the configuration of the isolation layer 640 may facilitate to improve the performance of the antenna structure 630 and the volume of the semiconductor package structure 600 may be compact. In some embodiments, the antenna structure 630 may be configured to transmit a microwave with low frequency, e.g. 28 GHz with a good performance.

The fabrication of the semiconductor package structure 600 may include the processes similar to those depicted in FIGS. 7 to 10, where the process of FIG. 7 may be applied in the embodiment to form the patches 634, the process of FIG. 8 may be applied in the embodiment to form the lateral antenna 660, the process of FIG. 9 may be applied in the embodiment to form the insulating encapsulation 610 and the RFIC chip 620, and the process of FIG. 10 may be applied in the embodiment to form the redistribution circuit structure 650 and the conductor layer 632. In addition, the isolation layer 640 may be laminated onto the circuit structure including the patches 634 before the process of forming the insulating encapsulation 610 and the process of attaching the RFIC chip 620. The process of attaching the RFIC chip 620 may include attaching the RFIC chip 620 onto the isolation layer 640 and the insulating encapsulation 610 may be formed subsequently to encapsulate the RFIC chip 620 and the isolation layer 640. In addition, the process of FIG. 11 and the process of FIG. 12 may be applied in the embodiment, such that the conductive bumps B may be connected to the redistribution circuit structure 650 for bonding to an external device.

Figure 18:
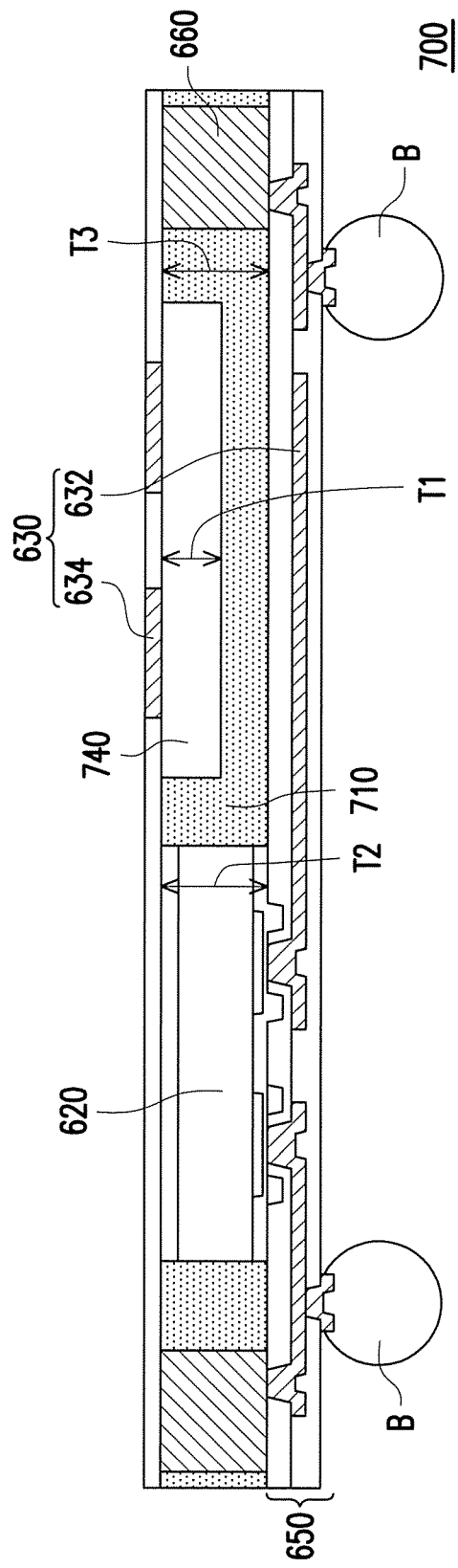
FIG. 18 schematically illustrates a cross section of a semiconductor package structure in accordance with some alternative embodiments.

FIG. 18 schematically illustrates a cross section of a semiconductor package structure in accordance with some alternative embodiments. In FIG. 18, a semiconductor package structure 700 may be similar to the semiconductor package structure 600 and include an insulating encapsulation 710, an RFIC chip 620, an antenna structure 630, an isolation layer 740, the redistribution circuit structure 650, and the lateral antenna 660. In the embodiment, the structures, the functions and the disposition locations of the RFIC chip 620, the antenna structure 630, the redistribution circuit structure 650 and the lateral antenna 660 may refer to those of the semiconductor package structure 600 and not reiterate. In the semiconductor package structure 700, the RFIC chip 620 and the isolation layer 740 are embedded in and encapsulated by the insulating encapsulation 710 and the RFIC chip 620 does not overlap the isolation layer 740 in the thickness direction. In other words, the isolation layer 740 may be located at a lateral side of the RFIC chip 620.

The thickness T1 of the isolation layer 740 may be smaller than the thickness T2 of the RFIC chip 620 while the thickness T2 of the RFIC chip 620 may be substantially the same as thickness T3 of the insulating encapsulation 710. In other words, the thickness T1 of the isolation layer 740 may be smaller than the thickness T3 of the insulating encapsulation 710. The isolation layer 740 and a portion of the insulating encapsulation 710 may overlap in the thickness direction and be interposed between the patches 634 and the conductor layer 632. The distance between the conductor layer 632 and the patches 634 may be greater than the thickness T1 of the isolation layer 640 and proximate to the thickness T3 of the insulating encapsulation 710. The dissipation factor of the isolation layer 740 is lower than that of the insulating encapsulation 710, such that the interference between the ground layer of the conductor layer 632 and the patches 634 may be reduced.

Figure 19:
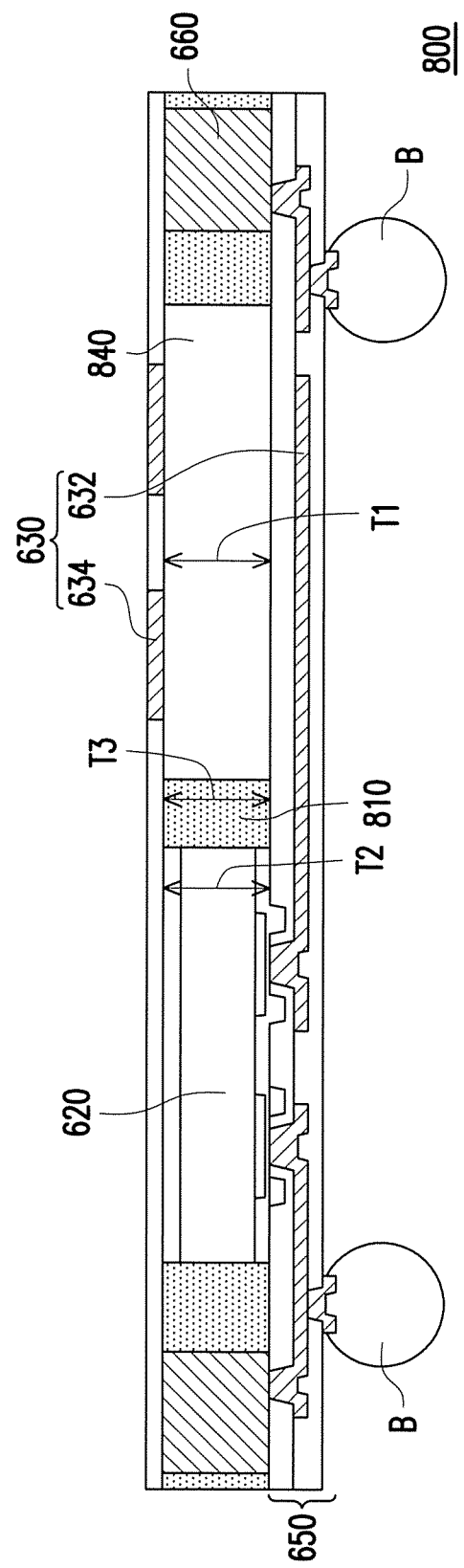
FIG. 19 schematically illustrates a cross section of a semiconductor package structure in accordance with some alternative embodiments.

FIG. 19 schematically illustrates a cross section of a semiconductor package structure in accordance with some alternative embodiments. In FIG. 19, a semiconductor package structure 800 may be similar to the semiconductor package structure 700 and include an insulating encapsulation 810, an RFIC chip 620, an antenna structure 630, an isolation layer 840, the redistribution circuit structure 650 and the lateral antenna 660. In the embodiment, the structures, the functions and the disposition locations of the RFIC chip 620, the antenna structure 630, the redistribution circuit structure 650 and the lateral antenna 660 may refer those of the semiconductor package structure 600 or 700 and not reiterate. In the semiconductor package structure 800, the thickness T1 of the isolation layer 840 may be substantially the same as the thickness T2 of the RFIC chip 620 as well as the thickness T3 of the insulating encapsulation 810. In the antenna structure 630, the conductor layer 632 is paced apart from the patches 634 by the isolation layer 840. The dissipation factor of the isolation layer 840 may be lower than that of the insulating encapsulation 810, such that the interference between the ground layer of the conductor layer 632 and the patches 634 may be reduced.

In accordance with some embodiments, a semiconductor package structure includes an encapsulation body, an RFIC chip, a first antenna structure, and a second antenna structure. The RFIC chip may be embedded in the encapsulation body. The first antenna structure may be disposed at a lateral side of the RFIC chip, electrically connected to the RFIC chip, and include a first conductor layer and a plurality of first patches opposite to the first conductor layer. The second antenna structure may be stacked on the RFIC chip, electrically connected to the RFIC chip, and include a second conductor layer and a plurality of second patches opposite to the second conductor layer. The first patches and the second patches are located at a surface of the encapsulation body. A first distance between the first conductor layer and the first patches is different from a second distance between the second conductor layer and the second patches. The encapsulation body may include a first insulating encapsulation and a second insulating encapsulation disposed on the first insulating encapsulation. The RFIC chip is embedded in the first insulating encapsulation. The second conductor layer is spaced apart from the second patches by the second insulating encapsulation. The first conductor layer is spaced apart from the second patches by the first insulating encapsulation and the second insulating encapsulation. In some embodiments, respective sizes of the first patches are larger than respective sizes of the second patches.

In accordance with some alternative embodiments, a semiconductor package structure includes a first insulating encapsulation, a second insulating encapsulation, an RFIC chip, a redistribution circuit structure, a first antenna structure and a second antenna structure. The second insulating encapsulation may be disposed on the first insulating encapsulation. The RFIC chip may be encapsulated by the first insulating encapsulation. The redistribution circuit structure may be disposed on the first insulating encapsulation and electrically connected to the RFIC chip. The first antenna structure may be disposed at a lateral side of the RFIC chip and electrically connected to the RFIC chip through the redistribution circuit structure. The first antenna structure includes a first conductor layer and a plurality of first patches spaced apart from the first conductor layer by the first insulating encapsulation and the second insulating encapsulation. The second antenna structure may be disposed on the RFIC chip and electrically connected to the RFIC chip through the redistribution circuit structure. The second antenna structure includes a second conductor layer and a plurality of second patches spaced apart from the second conductor layer by the second insulating encapsulation. The second conductor layer is located between the RFIC chip and the second patches. The first conductor layer is integrally formed in the redistribution circuit structure. A through via conductor penetrating through the first insulating encapsulation and being connected between the redistribution circuit structure and the second conductor layer is further included in the semiconductor package structure. A first through via conductor penetrating through the first insulating encapsulation and A second through via conductor penetrating through the second insulating encapsulation are further included in the semiconductor package structure, The first patches are electrically connected to the RFIC chip through the first through via conductor, the second through via conductor and the redistribution circuit structure. A connecting pattern connected between the first through via conductor and the second through via conductor is further included in the semiconductor package structure. The first through via conductor is connected to a first section of the connecting pattern and the second through via conductor is connected to a second section of the connecting pattern. A total thickness of the first insulating encapsulation and the second insulating encapsulation ranges from 600 μm to 800 μm. A dielectric layer may be disposed between the first insulating encapsulation and the second insulation encapsulation. One of the first insulating encapsulation and the second insulating encapsulation has a lower dissipation factor than the other. A lateral antenna embedded in the first insulating compound and electrically connected to the RFIC chip through the redistribution circuit structure is further included in the semiconductor package structure.

In accordance with some alternative embodiments, a semiconductor package structure may include an insulating encapsulation, an RFIC chip, an antenna structure, and an isolation layer. The RFIC chip may be embedded in the insulating encapsulation. The antenna structure may be disposed at a lateral side of the RFIC chip, electrically connected to the RFIC chip, and include a conductor layer and a plurality of patches opposite to the conductor layer. The isolation layer may be disposed between the conductor layer and the patches and embedded in the insulating encapsulation. A dissipation factor of the isolation layer is lower than that of the insulating encapsulation. The RFIC chip is stacked on the isolation layer. A thickness of the isolation layer is the same as a thickness of the insulating encapsulation. A thickness of the isolation layer is smaller than a thickness of the insulating encapsulation. A redistribution circuit structure is further disposed on the insulating encapsulation and electrically connected to the RFIC chip. The conductor layer is integrally formed in the redistribution circuit structure.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor package structure comprising:
an encapsulation body;
a radio frequency integrated circuit (RFIC) chip embedded in the encapsulation body;
a first antenna structure disposed at a lateral side of the RFIC chip, electrically connected to the RFIC chip, and comprising a first conductor layer and a plurality of first patches opposite to the first conductor layer; and
a second antenna structure stacked on the RFIC chip, electrically connected to the RFIC chip, and comprising a second conductor layer and a plurality of second patches opposite to the second conductor layer, wherein the first antenna structure is electrically insulated from the second antenna structure, the first patches and the second patches are located at a surface of the encapsulation body, and a first distance between the first conductor layer and the first patches is different from a second distance between the second conductor layer and the second patches.

2. The semiconductor package structure of claim 1, wherein the encapsulation body comprises a first insulating encapsulation and a second insulating encapsulation disposed on the first insulating encapsulation.

3. The semiconductor package structure of claim 2, wherein the RFIC chip is embedded in the first insulating encapsulation.

4. The semiconductor package structure of claim 2, wherein the second conductor layer is spaced apart from the second patches by the second insulating encapsulation.

5. The semiconductor package structure of claim 2, wherein the first conductor layer is spaced apart from the second patches by the first insulating encapsulation and the second insulating encapsulation.

6. The semiconductor package structure of claim 1, wherein respective sizes of the first patches are larger than respective sizes of the second patches.

7. A semiconductor package structure comprising:
a first insulating encapsulation;
a second insulating encapsulation disposed on the first insulating encapsulation;
an RFIC chip encapsulated by the first insulating encapsulation;
a redistribution circuit structure disposed on the first insulating encapsulation and electrically connected to the RFIC chip;
a first antenna structure disposed at a lateral side of the RFIC chip and electrically connected to the RFIC chip through the redistribution circuit structure, wherein the first antenna structure comprises a first conductor layer and a plurality of first patches spaced apart from the first conductor layer by the first insulating encapsulation and the second insulating encapsulation; and
a second antenna structure disposed on the RFIC chip and electrically connected to the RFIC chip through the redistribution circuit structure, wherein the first antenna structure is electrically insulated from the second antenna structure, the second antenna structure comprises a second conductor layer and a plurality of second patches spaced apart from the second conductor layer by the second insulating encapsulation, and the second conductor layer is located between the RFIC chip and the second patches.

8. The semiconductor package structure of claim 7, wherein the first conductor layer is integrally formed in the redistribution circuit structure.

9. The semiconductor package structure of claim 7, further comprising a through via conductor penetrating through the first insulating encapsulation and being connected between the redistribution circuit structure and the second conductor layer.

10. The semiconductor package structure of claim 7, further comprising a first through via conductor penetrating through the first insulating encapsulation and a second through via conductor penetrating through the second insulating encapsulation, wherein the first patches are electrically connected to the RFIC chip through the first through via conductor, the second through via conductor and the redistribution circuit structure.

11. The semiconductor package structure of claim 10, further comprising a connecting pattern connected between the first through via conductor and the second through via conductor, wherein the first through via conductor is connected to a first section of the connecting pattern and the second through via conductor is connected to a second section of the connecting pattern.

12. The semiconductor package structure of claim 7, wherein a total thickness of the first insulating encapsulation and the second insulating encapsulation ranges from 600 µm to 800 µm.

13. The semiconductor package structure of claim 7, further comprising a dielectric layer disposed between the first insulating encapsulation and the second insulation encapsulation.

14. The semiconductor package structure of claim 7, wherein one of the first insulating encapsulation and the second insulating encapsulation has a lower dissipation factor than the other.

15. The semiconductor package structure of claim 7, further comprising a lateral antenna embedded in the first insulating encapsulation and electrically connected to the RFIC chip through the redistribution circuit structure.

16. A semiconductor package structure comprising:
a first insulating encapsulation;
a second insulating encapsulation disposed on the first insulating encapsulation, wherein a dissipation factor of the first insulating encapsulation is different from that of the second insulating encapsulation;
an RFIC chip encapsulated by the first insulating encapsulation;
a redistribution circuit structure disposed on the first insulating encapsulation and electrically connected to the RFIC chip;
a first patch antenna structure disposed at a lateral side of the RFIC chip and electrically connected to the RFIC chip through the redistribution circuit structure; and
a second patch antenna structure overlapped with the RFIC chip and electrically connected to the RFIC chip through the redistribution circuit structure, wherein the first patch antenna structure and the second patch antenna structure perform wireless communication respectively.

17. The semiconductor package structure of claim 16, wherein the first conductor layer is integrally formed in the redistribution circuit structure.

18. The semiconductor package structure of claim 16, further comprising a first through via conductor penetrating through the first insulating encapsulation and a second through via conductor penetrating through the second insulating encapsulation, wherein the first patches are electrically connected to the RFIC chip through the first through via conductor, the second through via conductor and the redistribution circuit structure.

19. The semiconductor package structure of claim 16, further comprising a dielectric layer disposed between the first insulating encapsulation and the second insulation encapsulation.

20. The semiconductor package structure of claim 16, further comprising a lateral antenna embedded in the first insulating encapsulation and electrically connected to the RFIC chip through the redistribution circuit structure.

* * * * *